United States Patent
Lee

(10) Patent No.: US 7,718,493 B2
(45) Date of Patent: May 18, 2010

(54) METHOD FOR FORMING SEMICONDUCTOR DEVICE

(75) Inventor: Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 266 days.

(21) Appl. No.: 11/770,628

(22) Filed: Jun. 28, 2007

(65) Prior Publication Data
US 2008/0057634 A1 Mar. 6, 2008

(30) Foreign Application Priority Data
Sep. 4, 2006 (KR) .................... 10-2006-0084653

(51) Int. Cl.
*H01L 21/336* (2006.01)
(52) U.S. Cl. .................... 438/270; 438/268
(58) Field of Classification Search ............ 438/268, 438/270
See application file for complete search history.

(56) References Cited

U.S. PATENT DOCUMENTS

| 7,163,865 | B2 * | 1/2007 | Kim | .......................... | 438/270 |
| 2004/0145020 | A1 * | 7/2004 | Kang et al. | ................... | 257/350 |
| 2004/0259311 | A1 | 12/2004 | Kim | .......................... | 438/259 |
| 2006/0216885 | A1 | 9/2006 | Lee | .......................... | 438/243 |
| 2007/0004128 | A1 | 1/2007 | Jung | .......................... | 438/243 |

FOREIGN PATENT DOCUMENTS

| KR | 10-2004-0099533 | * 12/2004 |
| KR | 10200499533 | * 12/2004 |
| KR | 10-0609525 | 7/2006 |

* cited by examiner

*Primary Examiner*—Thanh V Pham
*Assistant Examiner*—Marvin Payen
(74) *Attorney, Agent, or Firm*—Marshall, Gerstein & Borun LLP

(57) ABSTRACT

A method for forming a semiconductor device of the present invention solves problems in a process for forming a fin type gate including a recess region, such as, a complicated process, low production margin, and difficulty in forming an accurate fin shape. In a process for forming an isolation dielectric film defining an active region, a nitride film pattern is formed in such a manner that the size of the nitride film is adjusted according to line width of a fin portion in a fin type active region formed in a subsequent process step, and an isolation dielectric film is formed in every region except for the nitride film pattern of a semiconductor substrate. Then, a recess is etched, and the isolation dielectric film is removed from a region where the line width of the nitride film pattern was reduced to a certain degree. Consequently, a process margin for forming a fin type active region is increased, and the shape of a fin shaped portion can be adjusted accurately, which together contribute to improved electrical properties in the semiconductor devices.

10 Claims, 11 Drawing Sheets (i)  (ii)

(i)  (ii)

METHOD FOR FORMING SEMICONDUCTOR DEVICE

CROSS-REFERENCE TO RELATED APPLICATION

The present invention claims the priority benefit of Korean patent application number 10-2006-0084653, filed on Sep. 4, 2006, which is incorporated herein by reference in its entirety.

BACKGROUND OF THE INVENTION

1. Field of the Invention

The present invention generally relates to a method for forming a semiconductor device. More particularly, the present invention relates to an improved method for forming a fin type gate including a recess region, which solves problems associated with prior art methods, such as, a complicated process, low production margin, and difficulty in forming an accurate fin shape. In a process for forming an isolation dielectric film defining an active region, a nitride film pattern is formed in such a manner that the size of the nitride film is adjusted according to a line width of a fin portion in a fin type active region formed in a subsequent process step, and an isolation dielectric film is formed in every region except for the nitride film pattern of a semiconductor substrate. Then, a recess is etched, and the isolation dielectric film is removed from a region where the line width of the nitride film pattern was reduced to a certain degree. Consequently, a process margin for forming a fin type active region is increased, and the shape of a fin-shaped portion can be adjusted accurately, which together contribute to the improvement of electrical properties of semiconductor devices.

2. Related Technology

With high integration trends for semiconductor devices, a process margin defining an active region and an isolation dielectric film is decreasing. A short channel effect also can occur due to a decrease in the channel length resulted from a narrowed line width of a gate. To overcome this, a multi-channel FET (McFET) such as a recess gate and a fin-type gate was introduced. Here, a recess gate structure is formed by etching a semiconductor substrate in an intended gate region to a designated depth, so as to increase the channel length. Meanwhile, a fin-type gate structure is formed by increasing a contact area between an active region and a gate, so as to increase drive capability of the gate and further, to improve electrical properties of a semiconductor device.

FIG. 1 is a plan view showing a conventional method for forming a semiconductor device.

In particular, an SRAM cell region shown in the drawing defines a bar-shaped active region over a semiconductor substrate 10.

Next, an isolation dielectric film 50 is formed in a region between active regions 20.

A gate 90 is then formed in such a manner that a designated region thereof overlaps with the active region 20. At this time, the gate 90 preferably includes a recess region and a fin-type active region.

FIGS. 2a through 2g are cross-sectional views showing a conventional method for forming a semiconductor device stepwise. In each drawing, (i) illustrates a cross-section taken along line XX' of FIG. 1, and (ii) illustrates a cross-section taken along line YY' of FIG. 1.

Referring to FIG. 2a, a first dielectric film pattern 25 and a first nitride film pattern 30 defining an active region are formed on a semiconductor substrate 10. The semiconductor substrate 10 is etched using the first nitride film pattern 30 as a mask, and the etched region is filled up with a dielectric film layer to form an isolation dielectric film 50. At this time, a first photoresist pattern is used to form the first dielectric film pattern 25 and the first nitride film pattern 30. However, a problem in forming the isolation dielectric film 50 is that after the first dielectric pattern 25 and the first nitride film pattern 30 are formed, the first photoresist pattern has to be removed and CMP process has to be performed all over again.

Referring to FIG. 2b, a second photoresist pattern (not shown) defining a recess region is formed over the first nitride film pattern 30, and the first nitride film pattern 30 is etched using the second photoresist pattern as a mask. The second photoresist pattern is removed again to provide a first nitride film pattern 35 defining a recess region.

Referring to FIG. 2c, a second dielectric film 40 is formed in a region between the isolation dielectric film 50 and the first nitride film pattern 35 defining a recess region, and CMP process is performed until the first nitride film pattern 35 defining a recess region is exposed.

Referring to FIG. 2d, the first nitride film pattern 35 defining a recess region is removed to form a second nitride film 45 on a sidewall of the second dielectric film 40.

Next, with the second dielectric film 40 and the second nitride film 45 as a mask, the semiconductor substrate 10 is etched to form a recess region 60. At this time, the recess region 60 and the isolation dielectric film 50 in a neighboring region are removed to form a fin type gate. Here, an active region 20 that is not etched by the second nitride film 45 becomes a fin, so the line width of the second nitride film 45 becomes the line width in a fin type active region. However, it is not easy to adjust the thickness of the second nitride film 45 formed like a spacer on the second dielectric film 40, and an etch selection ratio of the nitride film against the semiconductor substrate is not high. These cause the process margin for forming an accurate fin type active region to decrease.

Referring to FIG. 2e, the first dielectric film pattern 25, the second dielectric film 40, and the second nitride film 45 on the semiconductor substrate 10 are all removed, and the portion of the isolation dielectric film 50 that is adjacent to the recess region 60 and that overlaps with an intended gate region, is etched to form the fin type active region. At this time, the etching process needs to be carefully controlled in such a way that a portion of the fin type active region for forming a fin is as high as the recess region 60. In doing so, an unnecessary channel region in the longitudinal direction of the gate is also etched, making it difficult to adjust the shape of a fin.

Referring to FIG. 2f, after a gate dielectric film 70 is formed on the surface of the active region 20, a gate polysilicon layer 75, a gate conductive layer 80, and a gate insulating layer 85 are formed one after another on the entire surface of the semiconductor substrate 10.

Referring to FIG. 2g, the gate insulating layer 85, the gate conductive layer 80, and the gate polysilicon layer 75 are etched one after another by a mask defining a gate, to form a gate 90 defining the recess region 60 and the fin type active region.

As has been explained, the conventional method for forming a semiconductor device has a complicated process and a low production margin because it uses the first and second dielectric films as well as the first and second nitride films to form a recess region, and it is therefore necessary to repeatedly perform the photoresist mask pattern formation process and the CMP process for each. In addition, according to the conventional method, when the fin type active region is formed, the line width of a fin is determined by the second nitride film of FIG. 2d. However, it is not easy to adjust the thickness of the second nitride film that is formed like a spacer, and the etch selection ratio of the nitride film to the semiconductor substrate is not high, making it hard to provide an accurate fin shape.

SUMMARY OF THE INVENTION

In view of foregoing, a method for forming a semiconductor device is provided to resolve problems in a process for forming a fin type gate including a recess region, for example, a complicated process, low production margin, and difficulty in forming an accurate fin shape.

A first embodiment of the present invention provides a method for forming a semiconductor device, the method including the steps of: forming a nitride film pattern over a semiconductor substrate, the nitride film pattern including an insulating film on a sidewall thereof; etching the semiconductor substrate using the nitride film pattern and the insulating film as a mask, thereby forming a first trench defining an active region; removing the insulating film to form a second trench; forming an isolation dielectric film, thereby filling the second trench; removing the nitride film pattern; forming a hard mask pattern defining a recess region across the active region; etching the semiconductor substrate with the hard mask pattern, thereby forming a fin type active region in the recess region; removing the hard mask pattern; and forming a gate over the semiconductor substrate including the recess region, thereby filling the fin type active region.

A second embodiment of the present invention provides a method for forming a semiconductor device, the method including the steps of: forming a first dielectric film over a semiconductor substrate; forming a nitride film layer over the first dielectric film; forming, over the nitride film layer, a first photoresist pattern defining an active region equal to or smaller in size than an active region formed from conventional techniques by designated dimensions; etching the nitride film layer, the first dielectric film, and the semiconductor substrate using the first photoresist pattern as a mask, thereby forming a trench; removing the first photoresist pattern, and wet etching the surface of the etched nitride film layer to a designated thickness, thereby forming a nitride film pattern that is smaller than the active region by designated dimensions; etching the first dielectric film by using the nitride film pattern as a mask; forming an isolation dielectric film over an entire surface of the semiconductor substrate having the trench; etching the isolation dielectric film to lower a height of the same, and removing the nitride film pattern and the first dielectric film; forming a second dielectric film in a region with the first dielectric film removed therefrom; forming a second hard mask pattern on an entire surface of the semiconductor substrate; forming, over the second hard mask pattern, a second photoresist pattern exposing a recess region across the active region with a gate region over the semiconductor substrate and the isolation dielectric film; etching the second hard mask pattern, the second dielectric film, the semiconductor substrate, and the isolation dielectric film using the second photoresist pattern as a mask, thereby forming a fin type active region in the recess region; removing the second photoresist pattern and the second hard mask pattern; etching the second dielectric film and the isolation dielectric film, thereby exposing the surface of the active region; forming a gate dielectric film over the exposed surface of the active region; and forming a gate over the semiconductor region having the fin type active region and the recess region.

A third embodiment of the present invention provides a method for forming a semiconductor device, the method including the steps of: forming a first dielectric film over a semiconductor substrate; sequentially forming a nitride film pattern and a first hard mask pattern in designated sizes on an intended active region over the first dielectric film; forming an insulating film on sidewalls of the nitride film pattern and the first hard mask pattern; etching the first dielectric film and the semiconductor substrate using the insulating film and the first hard mask pattern as a mask, thereby forming a trench; removing the insulating film and the first hard mask pattern, thereby forming an isolation dielectric film on an entire surface of the semiconductor substrate having the trench; etching the isolation dielectric film to lower a height of the same, and removing the nitride film pattern and the first dielectric film; forming a second dielectric film in a region with the first dielectric film removed therefrom; forming a second hard mask pattern on an entire surface of the semiconductor substrate; forming, over the second hard mask pattern, a photoresist pattern exposing a region overlapping with an intended gate region and with the active region, and a vertical SOI (silicon on insulator) type region; etching, with the photoresist pattern as a mask, the second hard mask pattern, the second dielectric film, the semiconductor substrate, and the isolation dielectric film, thereby forming a recess region and a fin type active region; removing the photoresist pattern and the second hard mask pattern; etching the second dielectric film and the isolation dielectric film, thereby exposing the surface of the active region; forming a gate dielectric film over the exposed surface of the active region; and forming a gate over the semiconductor region having the vertical SOI type active region and the recess region.

A fourth embodiment of the present invention provides a method for forming a semiconductor device, the method including the steps of: forming a first dielectric film over a semiconductor substrate; forming a nitride film layer over the first dielectric film; forming, over the nitride film layer, a first photoresist pattern defining an active region equal to or smaller in size than an active region formed from conventional techniques by designated dimensions; etching the nitride film layer, the first dielectric film, and the semiconductor substrate using the first photoresist pattern as a mask, and the semiconductor substrate, to form a trench; removing the first photoresist pattern, and wet etching the surface of the etched nitride film layer to a designated thickness to form a nitride film pattern that is smaller in size than the active region by designated dimensions; etching the first dielectric film by using the nitride film pattern as a mask, forming an isolation dielectric film over an entire surface of the semiconductor substrate having the trench; etching the isolation dielectric film to lower height of the same, and removing the nitride film pattern and the first dielectric film; forming a second dielectric film in a region with the first dielectric film removed therefrom; forming a second hard mask pattern on an entire surface of the semiconductor substrate; forming, over the second hard mask pattern, a second photoresist pattern exposing a region overlapping with an intended gate region and with the active region, and a vertical SOI type region; etching the second hard mask pattern, the second dielectric film, the semiconductor substrate, and the isolation dielectric film using the second photoresist pattern as a mask, thereby forming a recess region and a fin type active region; removing the second photoresist pattern and the second hard mask pattern; etching the second dielectric film and the isolation dielectric film, thereby exposing the surface of the active region; forming a gate dielectric film over the exposed surface of the active region; and forming a gate over the semiconductor region having the vertical SOI type active region and the recess region.

Accordingly, the semiconductor device forming method of the present invention is characterized in that, during an isolation dielectric film forming process for defining an active region, a hard mask pattern or a nitride film pattern having the same shape and being equal to or smaller in size by designated dimensions than the active region is formed over a semiconductor substrate, and an insulating film with a designated line width is formed on sidewalls of the hard mask pattern or on sidewalls of the nitride film pattern. These structural features make it possible to form a normal fin shape for the fin type active region, and enhance the process margin of a semiconductor device. Furthermore, a channel region of the vertical SOI structure contributes to the improvement of electrical characteristics aid the enhanced drive voltage of a semiconductor device, leading to the reliability improvement in the semiconductor device.

The other objectives and advantages of the invention will be understood by the following description and will also be appreciated by the embodiments of the invention more clearly. Further, the objectives and advantages of the invention will readily be seen that they can be realized by the means and its combination specified in the claims.

DESCRIPTION OF SPECIFIC EMBODIMENTS

Hereinafter, preferred embodiments of the present invention will be set forth in detail with reference to the accompanying drawings so that those skilled in the art can easily carry out the invention.

Figure 1:
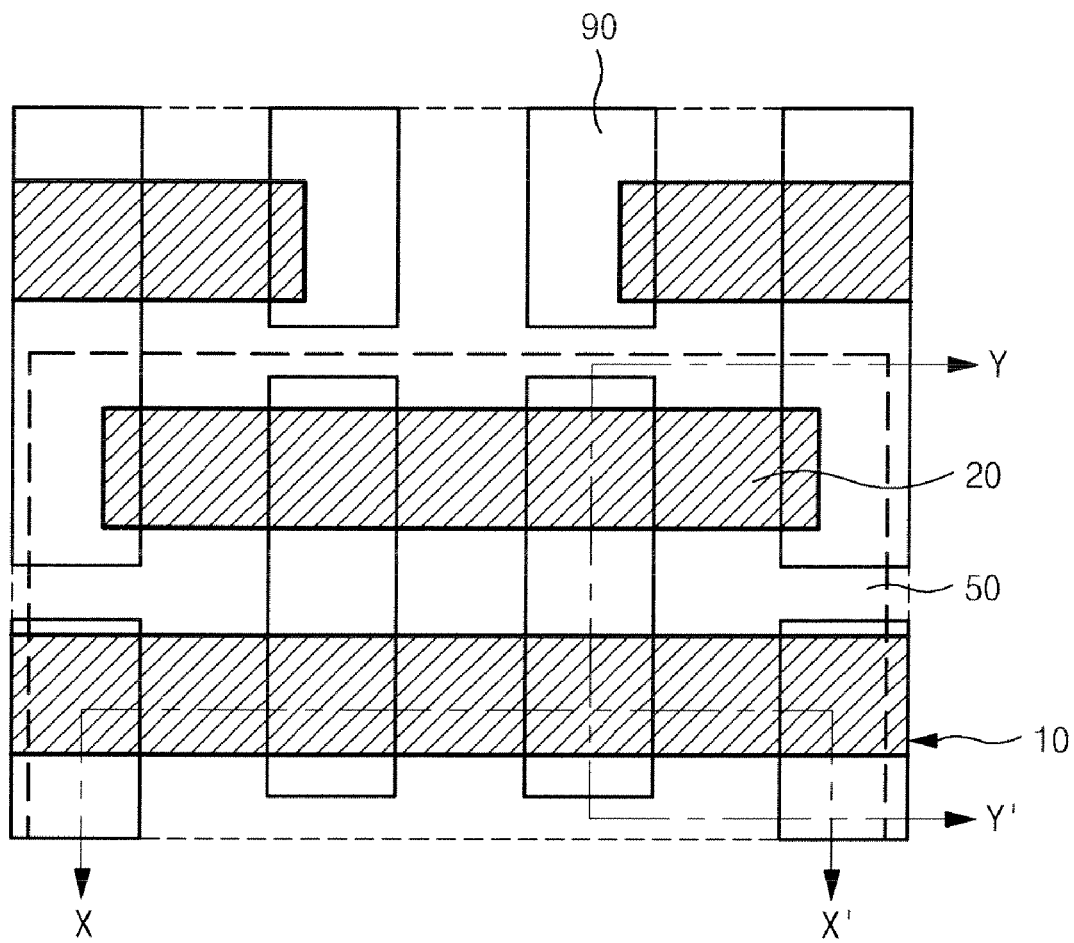
FIG. 1 is a plan view showing a conventional method for forming a semiconductor device.
Figure 2A:
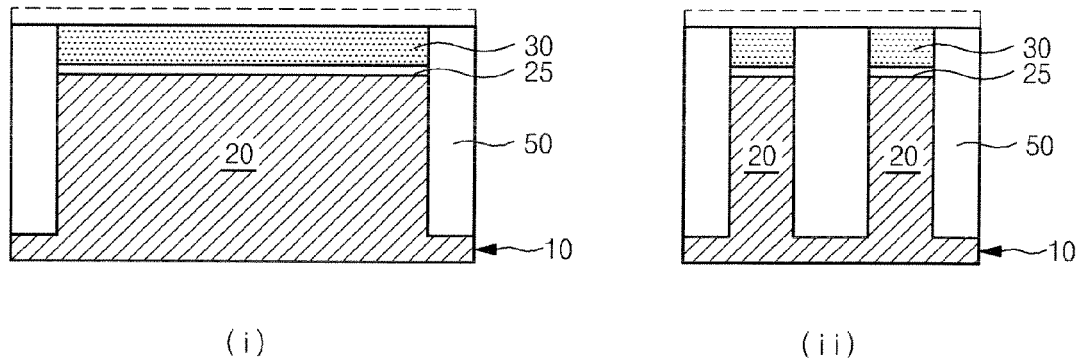
FIGS. 2a through 2g are cross-sectional views showing a conventional method for forming a semiconductor device stepwise.
Figure 2B:
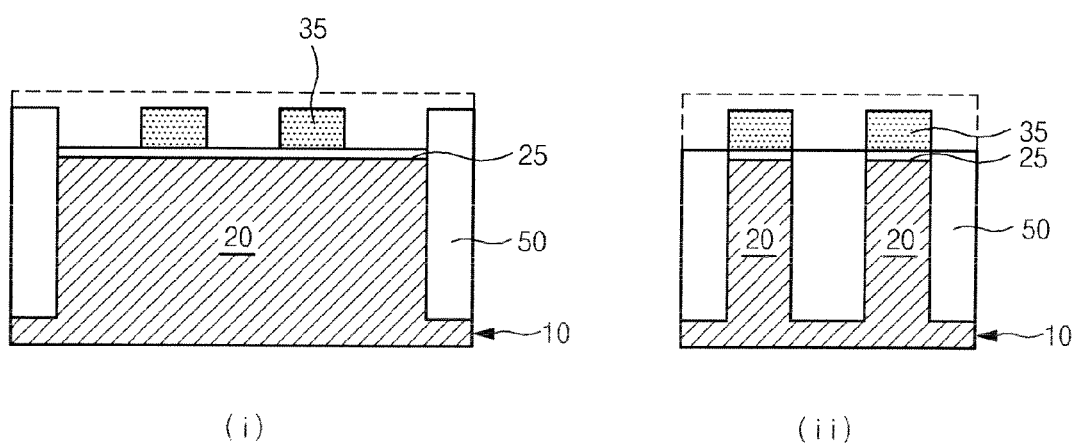
Figure 2C:
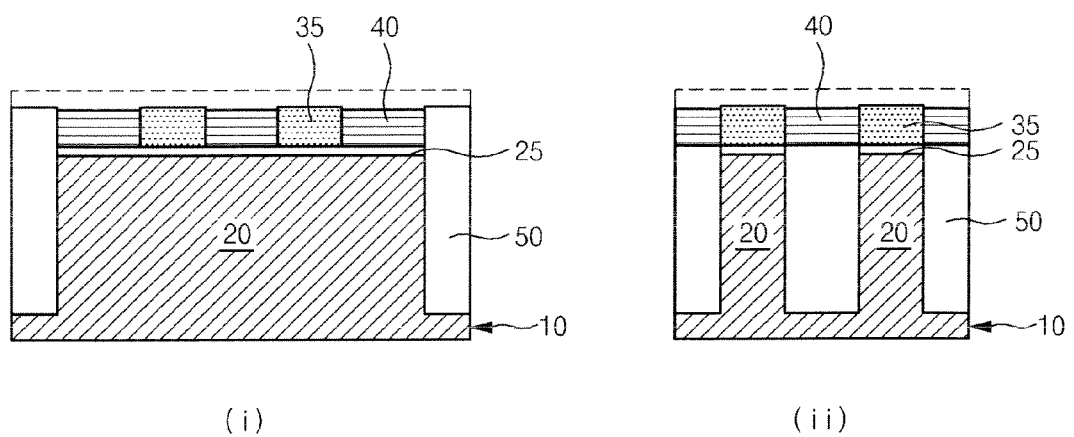
Figure 2D:
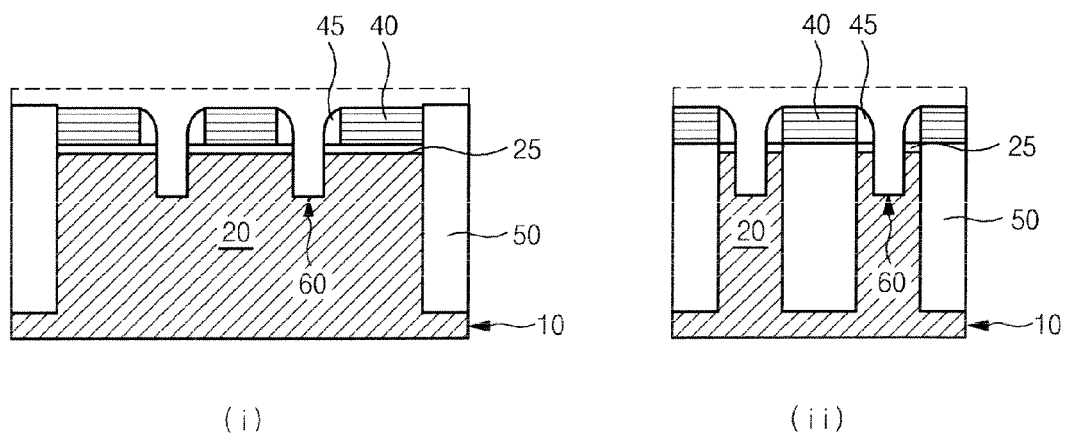
Figure 2E:
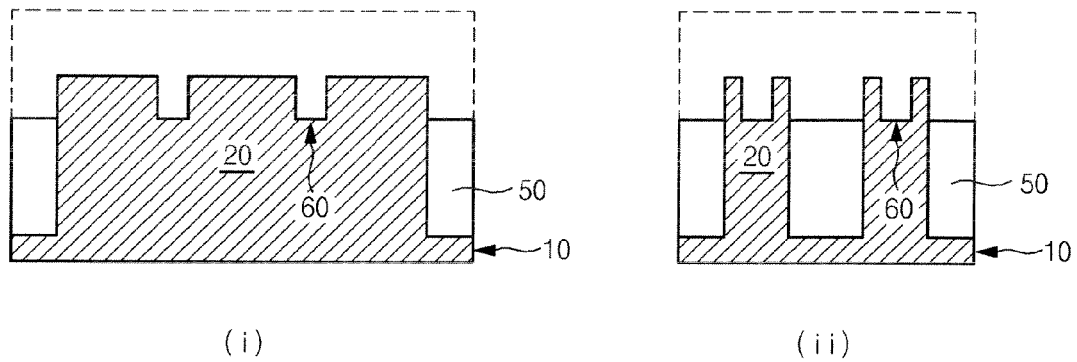
Figure 2F:
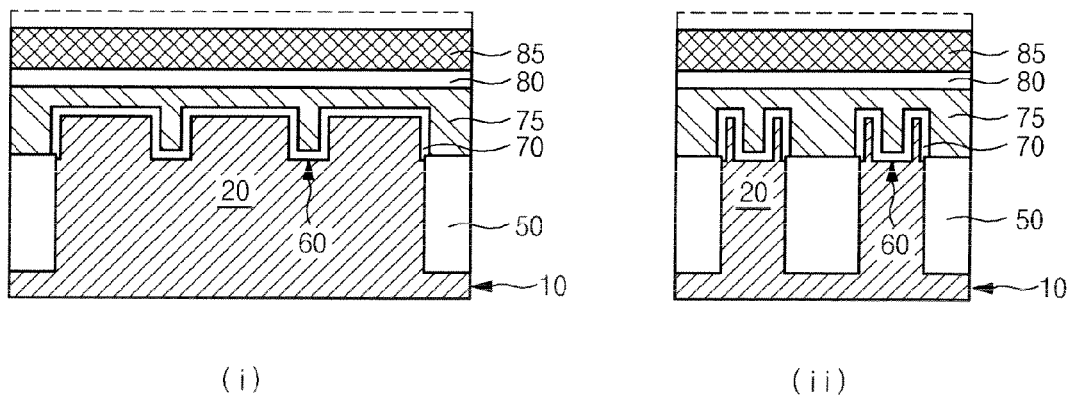
Figure 2G:
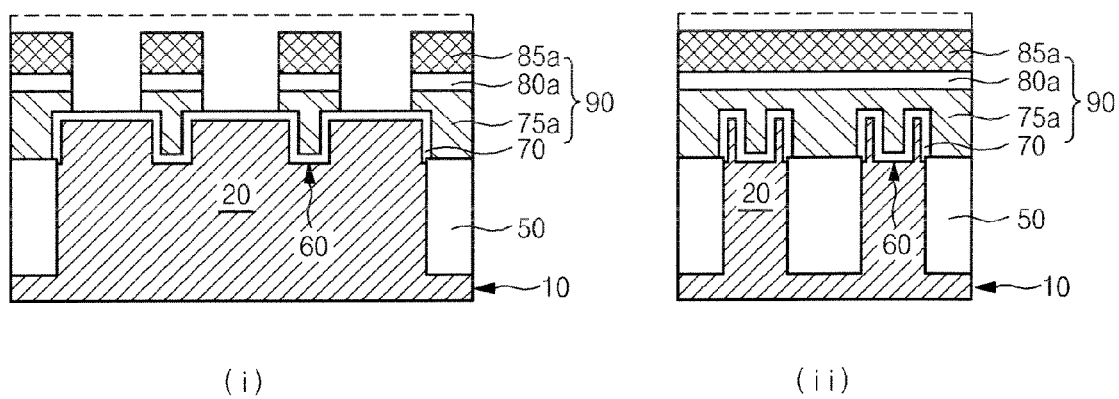
Figure 3:
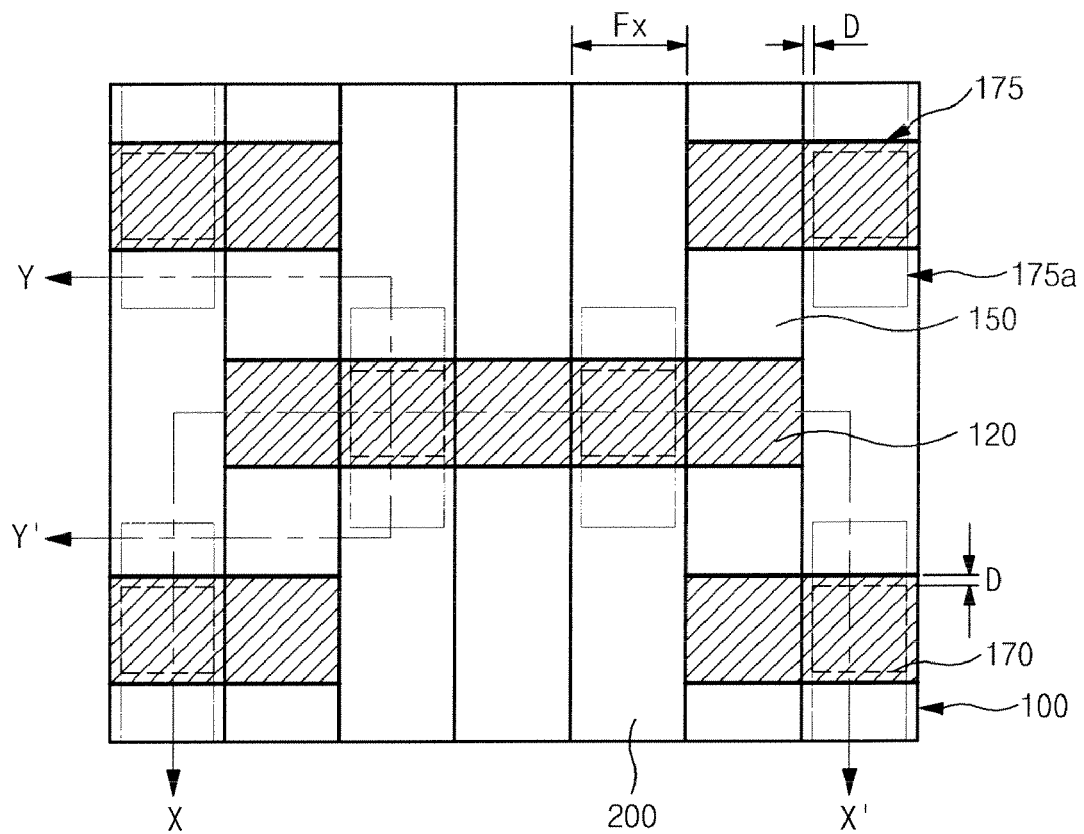
FIG. 3 is a layout view showing a method for forming a semiconductor device in accordance with a preferred embodiment of the present invention.

FIG. 3 is a layout view showing a method for forming a semiconductor device in accordance with a preferred embodiment of the present invention.

First of all, an active region 120 is defined, in which the active region is arranged over a semiconductor substrate 100 as an island type, and which has a bar-like planar shape.

Next, a recess gate region 170 and a fin type active region 175 are defined. That is, a recess region 170 having an overlapping portion with an intended gate region in the active region 120 of the semiconductor substrate 100, and a fin type active region 175 including a portion of an isolation dielectric film 150 in a neighboring region of the recess region 170 are defined.

Finally, a gate 200 is defined over the semiconductor substrate including the fin type active region 175.

Meanwhile, the recess region 170 and the fin type active region 175 underneath the gate 200 has a line width of 'Fx-2D', wherein 'Fx' indicates the line width of the gate 200 and 'D' is a value between 0 and (Fx/2), i.e., 0<D<(Fx/2), the value being determined taking account of an alignment error between the gate 200 and the recess gate region 170 and the fin type active region 175. Assuming that 'W' denotes the line width of the active region 120, the length of the fin type active region 175 in the gate 200 direction is longer than that of the active region 120 by 0 to W/2 in one direction, or 0 to W longer when both directions are taken into consideration.

FIGS. 4a through 4g are cross-sectional views illustrating a method for forming a semiconductor device in accordance with a first embodiment of the present invention, where (i) in each drawing shows a cross-section taken along with XX' of FIG. 3, and (ii) in each drawing shows a cross-section taken along with YY' of FIG. 3.

Figure 4A:
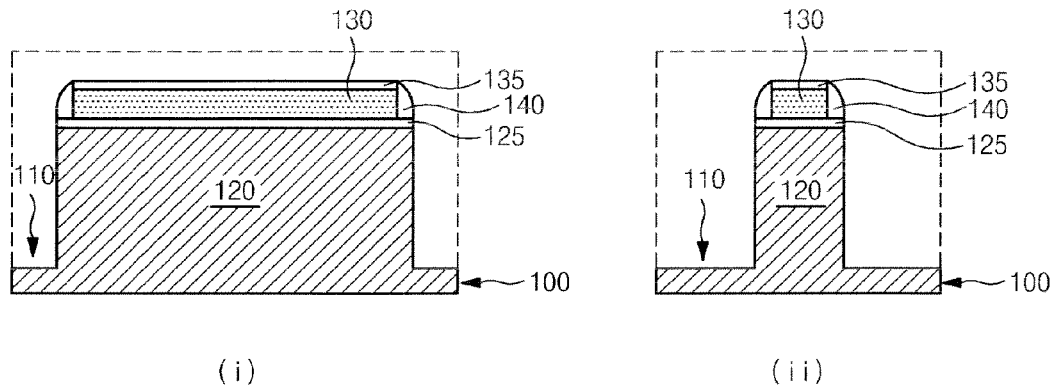
FIGS. 4a through 4g are cross-sectional views showing a stepwise method for forming a semiconductor device in accordance with a first embodiment of the present invention.

Referring first to FIG. 4a, a first dielectric film 125 is formed over a semiconductor substrate 100.

A nitride film and a first hard mask pattern are formed one after another over the first dielectric film, and a first photoresist pattern (not shown) defining an active region 120 having a designated size equal to or smaller than the conventional active region by designated dimensions is formed over the first hard mask pattern.

The first hard mask pattern and the nitride film are etched using the first photoresist pattern as a mask, to form a first hard mask pattern 135 and a nitride film pattern 130.

The first photoresist pattern is removed, and an insulating film 140 is formed on sidewalls of the first hard mask pattern 135 and nitride film pattern 130. At this time, taking in account the fact that the thickness of the silicon semiconductor substrate 100 decreases in subsequent processing steps, the line width of the insulating film 140 should have a value greater than the line width of a fin in a final fin type active region.

Next, with the insulating film 140 and the first hard mask pattern 135 as a mask, the first dielectric film 125 and the semiconductor substrate 100 are etched to form a device isolation trench 110.

Figure 4B:
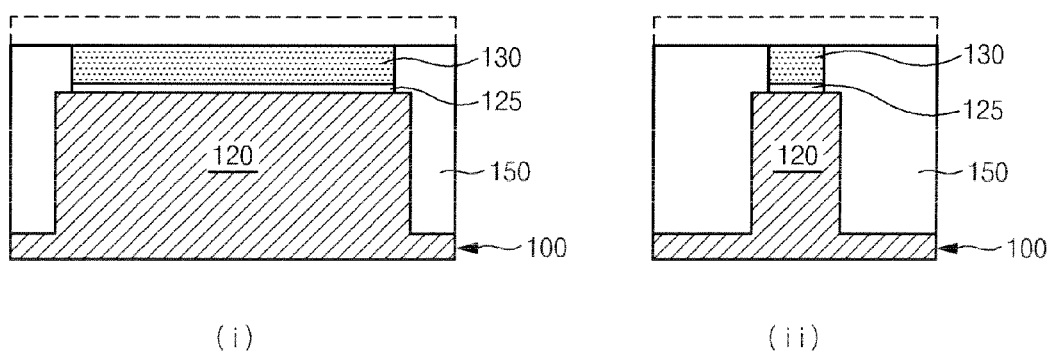

Referring to FIG. 4b, the insulating film 140 and the first hard mask pattern 135 are removed by wet etching.

Next, a space (gap) between the etched device isolation trench 110 and the nitride film pattern 130 is filled up with an isolation dielectric film. Following the deposition of the isolation dielectric film, a CMP process is performed until the nitride film pattern 130 is exposed, thereby forming the isolation dielectric film 150 by filling up the device isolation trench 110 of FIG. 4a as well as the region between the first dielectric film 125 and the nitride film pattern 130. After a thermal oxide film, a nitride film, and a dielectric film layer are sequentially formed on the surface of the trench, an isolation dielectric film layer may be additionally formed.

Figure 4C:
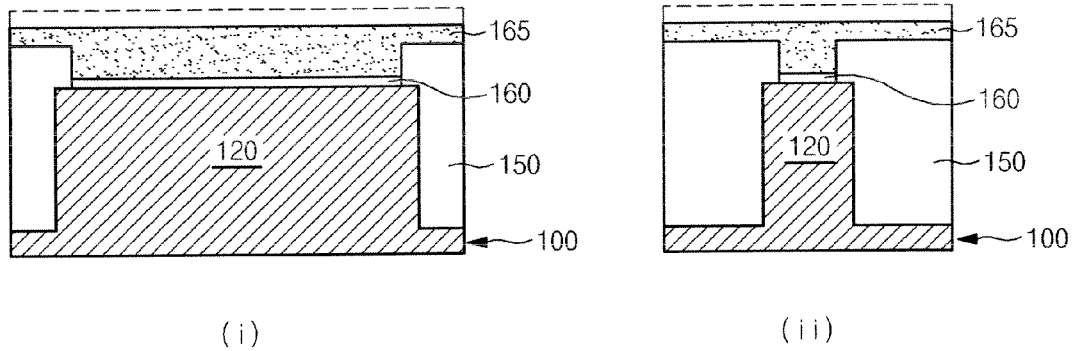

Referring to FIG. 4c, the height of the isolation dielectric film 50 is reduced by wet etching, and the nitride film pattern 130 and the first dielectric film 125 are removed.

A second dielectric film 160 is formed in a region from which the first dielectric film had been removed.

Next, well and channel ion-implantation is performed on an entire surface of the semiconductor device 100, helping the active region be able to function as a channel region. The well and channel ion-implantation may be performed in two ways. One of them is that the channel ion-implantation is first performed on a core and a peri region of the semiconductor substrate 100 after a mask pattern is formed in a cell region. As the mask pattern is removed from the cell region and is later formed in the core and peri regions again, the ion-implantation is performed on the cell region. The other is that the ion-implantation is first performed in the cell region, and the mask pattern is formed on the core region and then on the peri region.

A second hard mask pattern 165 is formed over the second dielectric film 160.

Figure 4D:
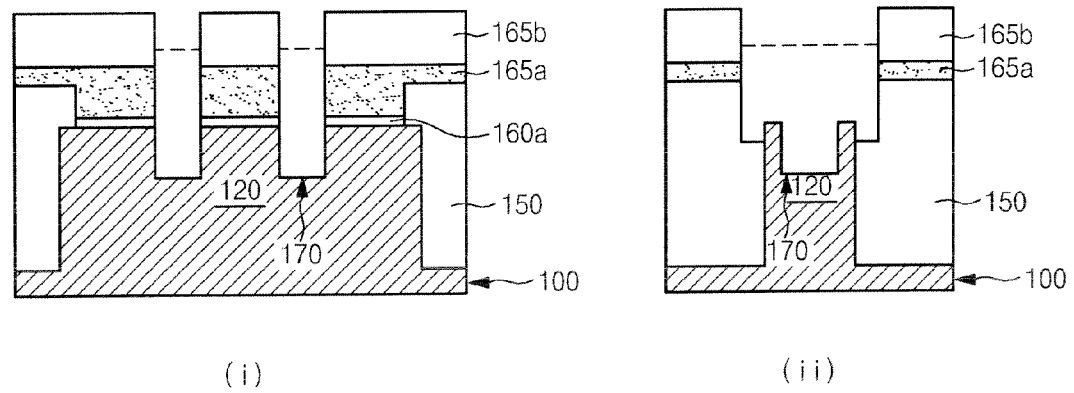

Referring to FIG. 4d, a second photoresist pattern 165b is formed over the second hard mask pattern 165 in such a way to expose a designated portion of a region overlapping with an intended gate region and with the active region 120, that is, an intended recess region and an etching region for forming a fin type active region as in (ii) of FIG. 4d.

With the second photoresist pattern 165b as a mask, the second hard mask pattern 165 and the second dielectric film 160 are etched, to form a second hard mask pattern 165a and a second dielectric film pattern 160a.

After this, the semiconductor substrate 100 is etched using the second photoresist pattern 165b, the second hard mask pattern 165a, and the second dielectric film pattern 160a as a mask, to form a recess region 170.

Figure 4E:
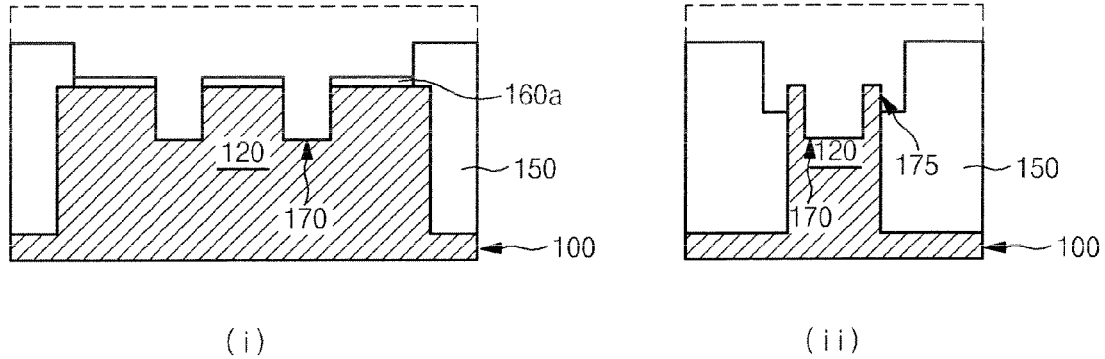

Referring to FIG. 4e, the isolation dielectric film 150 adjacent to the recess region is etched to complete the formation of a fin 175 in the fin type active region.

Next, the remaining second photoresist pattern 165b and the second hard mask pattern 165a are removed simultaneously. At this time, it is desired to completely remove the hard mask pattern 165 according to the etch selection ratio while the recess region 170 and the fin 175 in the fin type active region are formed. Even when part of the pattern may remain, it is preferable to remove the second photoresist pattern 165b and the second hard mask pattern 165 at the same time.

As shown in (ii) in FIG. 4e, the line width of the fin 175 is narrower than the line width of the insulating film shown in (ii) of FIG. 4a. This indicates that the line width of the fin 175 can easily be controlled by controlling the thickness of the insulating film.

Figure 4F:
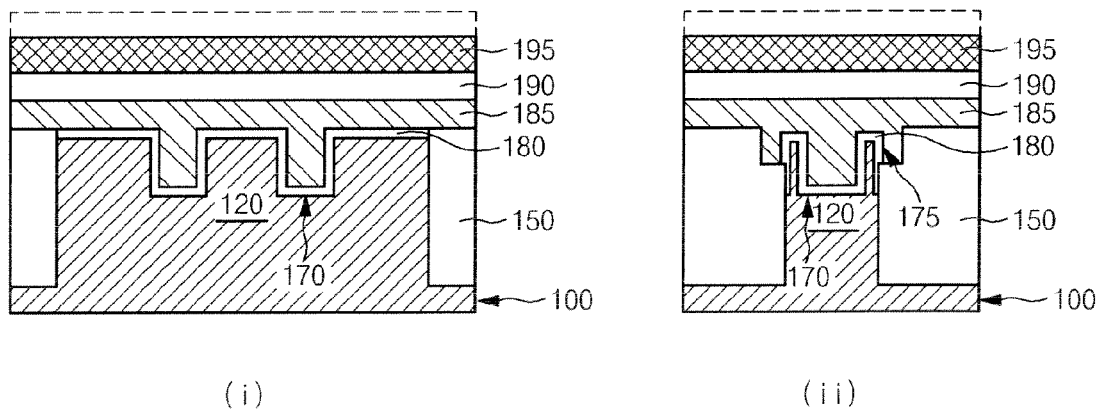

Referring to FIG. 4f, the second dielectric film pattern 150a is removed by etching. At this time, it is desirable to etch the isolation dielectric film 150 at the same time to make its surface as high as the active region 120 or slightly higher.

Next, a gate dielectric film 180 is formed on the surface of the active region 120.

A lower gate electrode layer 185 is formed on an entire surface of the semiconductor substrate 100 including the fin type active region and the recess region 170. Then, the lower gate electrode layer 185 is planarized again.

An upper gate electrode layer 190 and an upper gate insulating film 195 are formed sequentially over the lower electrode layer 185.

Figure 4G:
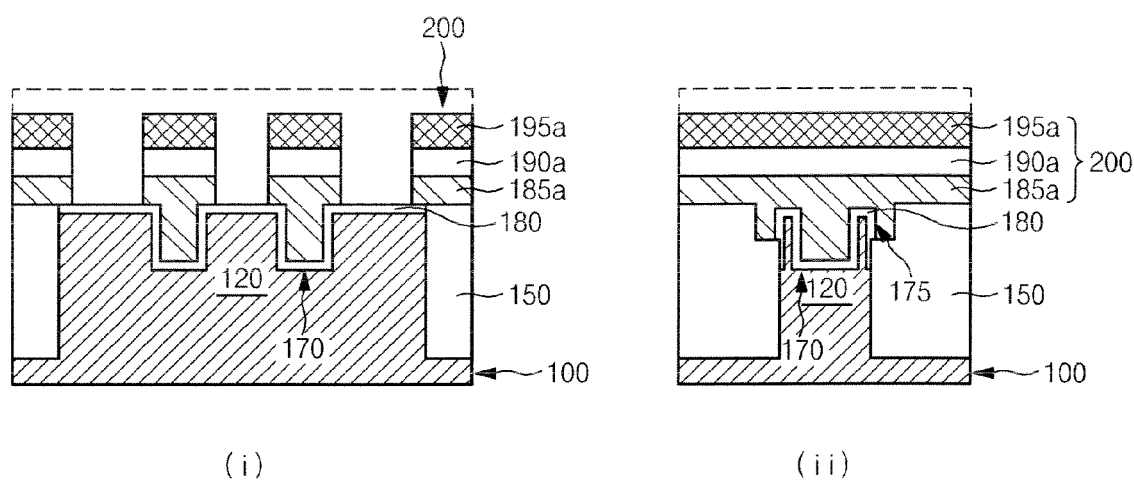

Referring to FIG. 4g, the upper insulating film, the upper electrode layer, and the lower electrode layer are etched one after another with a gate mask (not shown), to form an upper insulating film pattern 195a, an upper electrode layer pattern 190a, and a lower electrode layer pattern 185a, which defining a gate 200.

Next, in order to complete a transistor, a number of processes are performed in sequence, such as, a lightly doped drain (LDD) region is formed in a region between the gates 200 by ion implantation a spacer insulating film is formed on sidewalls of the gate 200, ion implantation is performed on source/drain regions, a plug to be electrically connected to the source/drain regions is formed, a bit line contact and a bit line are formed, a capacitor contact and a capacitor are formed, and finally a metal wire contact and a metal wire are formed.

Figure 5A:
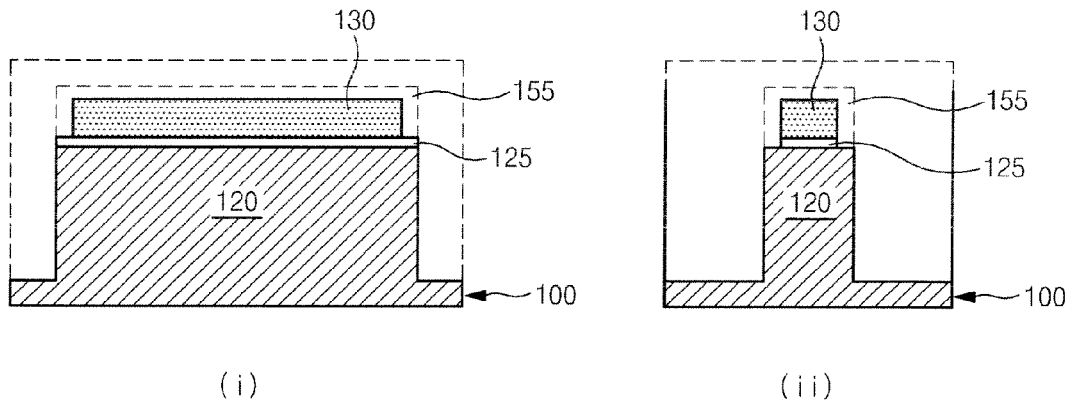
FIGS. 5a and 5b are cross-sectional views showing a method for forming a semiconductor device in accordance with a second embodiment of the present invention.
Figure 5B:
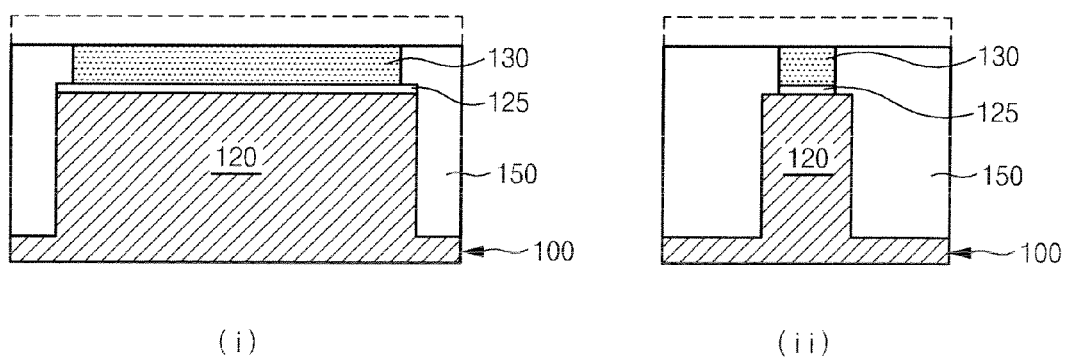

FIGS. 5a and 5b are cross-sectional views showing a method for forming a semiconductor device in accordance with a second embodiment of the present invention, where (i) in each drawing shows a cross-section taken along with XX' of FIG. 3, and (ii) in each drawing shows a cross-section taken along with YY' of FIG. 3.

Referring first to FIG. 5a, a first dielectric film 125 is formed on an entire upper surface of a semiconductor substrate 100.

A nitride film (not shown) is formed over the first dielectric film 125.

Next, a first photoresist pattern (not shown) defining an active region 120 having a size equal to or greater than the conventional active region by designated dimensions is formed.

The nitride film is etched using the first photoresist pattern as a mask to form a nitride film pattern 130. Further, the first dielectric film 125 and the semiconductor substrate 100 are etched to form a device isolation trench.

The first photoresist pattern is removed, and a portion of the thickness of the surface of the etched nitride film is etched away to form a nitride film pattern 130 that is smaller than the active region by designated dimensions.

Referring to FIG. 5b, the first dielectric film 125 is etched using the nitride film pattern 130 as a mask. The device isolation trench and a space between the first dielectric film 125 and the nitride film pattern 130 are filled up with an isolation dielectric film 150.

As explained herein, the semiconductor forming method according to the second embodiment of the present invention differs from the first embodiment in that the first hard mask pattern and the insulating film of the first embodiment are replaced with the photoresist pattern. Therefore, the nitride film is wet etched to form the size-reduced nitride film pattern, and the isolation dielectric film is formed next. Meanwhile, the steps after this point are the same as that of FIG. 4c through FIG. 4g.

In addition, a third embodiment may be constructed by incorporating the same steps up to FIG. 4d as in the first embodiment, but, in the step of FIG. 4e, the remaining second photoresist pattern 165b and second hard mask layer pattern 165a are removed without etching the recess region 170 and its neighboring isolation dielectric film 150. Furthermore, a fourth embodiment may be constructed by incorporating the same steps as in FIG. 5a, FIG. 5b, FIG. 4c, and FIG. 4d, but, in the step of FIG. 4e, the remaining second photoresist pattern 165b and second hard mask layer pattern 165a are removed without etching the recess region 170 and its neighboring isolation dielectric film 150. In short, the third and fourth embodiments, unlike the first and second embodiments of the present invention, do not include the step in FIG. 4e, so the channel is not formed into a fin type active region, but into a vertical SOI type active region. The subsequent steps are the same as those in FIGS. 4f through 4g.

As has been explained, in an isolation dielectric film forming process for defining an active region, a hard mask pattern or a nitride film pattern having the same shape in equal size or smaller than the active region is formed over a semiconductor substrate, and an insulating film with a designated line width is formed on sidewalls of the hard mask pattern or of the nitride film pattern. In this manner, the subsequent process step for forming a fin type active region can be done more easily. Moreover, because the expansion of an unnecessary channel region (this is one of problems in conventional techniques) does not necessarily occur, the contact area of a plug being electrically connected to the source/drain region can be increased. Resultantly, the leakage current is reduced, and the refresh characteristics of a semiconductor device are improved. Meanwhile, a channel region of the vertical SOI structure can reduce short channel effects, thereby improving threshold voltage characteristics.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A method for forming a semiconductor device, comprising the steps of:
    forming a nitride film pattern including an insulating film on a sidewall thereof over a semiconductor substrate;
    etching the semiconductor substrate using the nitride film pattern and the insulating film as a mask, to form a first trench defining an active region;
    removing the insulating film to form a second trench;
    forming an isolation dielectric film in the second trench, thereby filling the second trench;
    removing the nitride film pattern;
    forming a hard mask pattern defining a recess region across the active region;
    etching the semiconductor substrate with the hard mask pattern, thereby forming a fin type active region, wherein a center portion of the fin type active region is etched in the recess region;
    removing the hard mask pattern; and
    forming a gate over the semiconductor substrate including the recess region, thereby filling the fin type active region.

2. The method of claim 1, further comprising the step of: removing the insulating film by wet etching.

3. The method of claim 1, wherein the isolation dielectric film forming step comprises:
    removing the insulating film;
    filling up the trench and a space where the insulating film is removed, thereby forming a dielectric film; and
    etching the dielectric film by chemical mechanical polishing (CMP) until the nitride film pattern is exposed, thereby forming the isolation dielectric film.

4. The method of claim 3, further comprising the step of: forming a thermal oxide film, a nitride film and a dielectric film on the surface of the trench.

5. The method of claim 1, further comprising the step of: performing well and channel ion-implantation on the semiconductor substrate.

6. The method of claim 5, comprising performing the well and channel ion implantation on a core region, a pen region, and a cell region of the semiconductor substrate.

7. The method of claim 1, wherein the recess region comprises a portion of the active region which overlaps with the gate region and a portion of the isolation dielectric film adjacent to the active region.

8. The method of claim 1, wherein the process of forming the fin type active region is comprises selectively etching between the semiconductor substrate and the isolation dielectric film exposed in the recess region.

9. The method of claim 1, wherein the process forming the fin type active region comprises:
    etching the semiconductor substrate with the hard mask pattern, thereby forming the recess region; and
    etching the isolation dielectric film with the hard mask pattern, thereby forming the fin type active region in the recess region.

10. The method of claim 1, wherein the gate forming step comprises:
    forming a gate lower electrode layer, thereby filling up the fin type active region and the recess region;
    planarizing the gate lower electrode layer;
    sequentially forming a gate upper electrode layer and a gate upper insulating film over the lower electrode layer; and
    sequentially etching the gate upper insulating film, the gate upper electrode layer, and the gate lower electrode layer with a gate mask.

* * * * *